United States Patent
Dancel et al.

(10) Patent No.: US 7,163,424 B2
(45) Date of Patent: Jan. 16, 2007

(54) HOUSING FOR A THIN ACTIVE PROBE

(75) Inventors: Michael Dancel, Colorado Springs, CO (US); James E. Cannon, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 812 days.

(21) Appl. No.: 10/608,762

(22) Filed: Jun. 27, 2003

(65) Prior Publication Data

US 2004/0267109 A1    Dec. 30, 2004

(51) Int. Cl.
*H01R 13/514* (2006.01)
(52) U.S. Cl. ..................................... 439/731
(58) Field of Classification Search ............... 439/731, 439/687, 447, 482
See application file for complete search history.

(56) References Cited

U.S. PATENT DOCUMENTS

| | | | | |
|---|---|---|---|---|
| 5,685,736 | A * | 11/1997 | Lung | 439/447 |
| 5,695,357 | A * | 12/1997 | Wright | 439/394 |
| 6,916,194 | B1 * | 7/2005 | Sichner et al. | 439/271 |
| 6,971,905 | B1 * | 12/2005 | Makita et al. | 439/447 |
| 7,021,959 | B1 * | 4/2006 | Tsuji et al. | 439/470 |

* cited by examiner

*Primary Examiner*—Tulsidas C. Patel
*Assistant Examiner*—Phuongchi Nguyen
(74) *Attorney, Agent, or Firm*—Edward L. Miller

(57) ABSTRACT

A housing for a thin active probe has two identical molded housing-halves that when assembled form a cavity that encloses the chassis upon which is carried the active circuitry of the probe. The parts exhibit complementary self-symmetry about a longitudinal axis, such that when one is rotated about that axis it performs the mating functions needed to interlock with another part representing its unrotated self. Interlocking is accomplished by circular tabs and sockets that interfere and prevent the parts from separating once the tabs are in the sockets. The circular tabs are joined to the balance of the housing-half that carries them by a narrow neck and can be sprung over the other housing-half to return to their natural position and fit into a circular socket in that other housing-half. A tapered edge or ramp portion on the underside of each circular tab allows it to automatically spring out of the way as the two parts are moved toward each other in a direction generally perpendicular to the longitudinal axis of the parts. Each circular socket contains a stop that prevent its tab from completely passing through the socket. Each housing-half has a straight tab between its circular tabs that enter an interior recess on the other housing-half to support its circular sockets as they receive their tabs. Each housing-half contains in a front surface an entire aperture for a detachable probe lead, and each contains in a rear surface at least one half-aperture that, when the two housing-halves are joined, forms a larger aperture whose perimeter engages a corresponding groove in a strain relief for a cable. The exterior surface of the mated housing-halves has, on each side through which runs the line of the mating edges, a flat shallow recess. The interlocking circular tabs and sockets are located within the extent of this shallow recess, which can receive an adhesive label that may conceal and stiffen the interlocking circular tabs and sockets.

12 Claims, 7 Drawing Sheets

HOUSING FOR A THIN ACTIVE PROBE

BACKGROUND OF THE INVENTION

Various types of electronic test equipment use hand held probes to establish an electrical connection between the test equipment and a work piece. Sometimes these probes are passive; that is, they contain no active elements, such as FETs or bipolar transistors. Absent some special consideration, passive probes can generally be small, and their size is set by what is comfortable to handle, on the one hand, and functional in terms of electrical performance, on the other. (There are exceptions, of course, such as the foot long 30 KV high voltage probe for a voltmeter.) Active probes are necessitated by particular electrical considerations, generally involving high frequency operation and impedance. So, for example, an oscilloscope probe that is expected to work into the several gigahertz region needs to prevent the length of cable connecting the probe to the test equipment from being seen by the work circuit and must also exercise rigorous control over the stray reactances that the probe is allowed to bring into contact with the work circuit. The former requirement necessitates amplification, while the latter generally means keeping the actual contact leads short, sometimes very short, and locating an impedance conversion amplifier very close to the point of measurement. Hence the term 'active probe' arises; the impedance conversion (and other functions, too) are performed by significant collections of high performance active circuitry (typically a 'hybrid circuit') located in the probe itself. A hybrid circuit is often a small ceramic substrate with printed conductors and components mounted thereon, usually including one or more integrated circuit dies (shorn of their usual plastic encapsulation).

Some high performance active probes dissipate a modest amount of power to accomplish their tasks; hence, they have to shed heat through surface area. They are, by their very nature, 'electrically exposed,' as it were, and are not infrequently through ignorance, carelessness or plain bad luck, damaged by contact with excessive voltages. They can also be relatively expensive as small things go (say, on the order of a thousand dollars), and it is common for them to be returned to the factory for repair (vendors will sometimes offer loaners to the unfortunate owners during the interim . . . ). All of this means that active probes tend to be bigger than their passive brethren; you can generally always spot one because of its fat cable and its portly appearance. See FIG. 1.

The forgoing does not mean that presently available active scope probes and other active probes do not electrically perform as intended. But it sometimes happens, and given present trends in assembly design, with increasing frequency, that the physical size of the probe prevents it from being brought as close as desired to a point of contact within the work circuit. Consider a number of printed circuit boards plugged into a mother board, so as to all be parallel, one next to the other and spaced a minimum distance apart. It is necessary to probe a location at or near the middle of one of the interior boards. It often happens that the probe simply won't fit into the available space, and circuit performance (or lack of space) precludes the use of an extender board. A common solution is this situation is, with the board removed, to solder or otherwise attach a needed length of lead (or leads, if the probe is differential, and we mustn't forget about a possible ground lead) to the probe and to the work circuit, replace the board, and then make the measurement with the probe near, but outside, the space occupied by the boards.

There are some disadvantages to this. The leads tend to be made afresh each time to fit the circumstances, and they are almost always longer than desired (which would probably be 'as short as practical'). The result is a nagging uncertainty in the quality of the measurement: what would the measurement have been if those leads were truly of minimum length?

One thing that can be done to ameliorate this situation is to make the body of the active probe thin enough that it can fit between the boards. Then the leads can be no longer than absolutely necessary. We may still need to solder some short leads that extend from the probe to the point of electrical contact, simply because of the geometry of the parts involved: there is no way to clip or hook the probe tip to the circuit (e.g., grab onto a component leg), or even if there is, it won't work because the probe will not both stay hooked and lay flat against the board to occupy the available space between the boards. But if the probe is thin enough, and will go into that available space, then we can expect that some very short leads manufactured for the purpose, will satisfactorily perform the interconnection task. What is more, there may well be a performance advantage in that the probe's electrical behavior is more repeatable and readily characterized when it always has the same type and length of flexible extension.

So, we set out to make a not-too-long probe that trades an increase in width for a drastic decrease in thickness. The innards of the probe can be a suitable hybrid circuit fabricated on a ceramic substrate. The departure from a circular cross section means that there will be plenty of surface area to dissipate heat, and it is not so small that it cannot be actually hand held if need be. (The probe even has tiny connectors in the front so that the flying leads can be disconnected and replaced with a different set of flexible leads or with rigid prongs, if desired.)

Now, in some ways an active probe is just like any other electronic apparatus. It has a chassis of some sort, that carries one or more assemblies that have the actual parts. It also has an outer housing that both mechanically and electrically protect the insides from what's one the outside (and probably vice versa, as well). Probes have cables that lead back to the test equipment they are associated with, and something has to anchor that cable to the probe body. It is not unreasonable to expect a probe housing to engage a boot or strain relief molded onto the probe end of the probe cable.

Given that the probe IS NOT a throw-away item, the housing needs to be something that can perform its protective (and anchoring) duties without preventing successful recovery of the innards. It also needs to be inexpensive and reliable, not to mention, simpler is better, as is fewer parts. No messy glues should be needed that could migrate to the interior and interfere with later disassembly. Tiny threaded fasteners come to mind, but they consume space on the part, are fussy and add cost, not to mention aggravation (you heard that little screw hit the floor, but now it's GONE!). Interlocking plastic pieces come naturally to mind. They can be tough, strong, insulating, and molded into particular shapes. But whatever it is, it needs to be thin, so as to not add any extra unnecessary thickness to the finished probe body. And for aesthetic reasons, as well as to discourage (or at least make evident) tampering with parts that may be under warranty ("but we can't fix it if you tried to fix it first . . . "), the exact manner of how the protective cover pieces join themselves should be covered by a single use (or tamper-evident) adhesive label (which can also carry the manufacturer's logo and the probe's model number, etc.). None of these wished-for properties is an unusual one, considered in isolation. But we really need to satisfy the list with a housing that lets the active probe remain THIN!

What to do?

SUMMARY OF THE INVENTION

A housing for a thin active probe has two identical molded plastic parts (housing-halves) that when assembled form a cavity that encloses the chassis upon which is carried the active circuitry of the probe. The parts exhibit complementary self-symmetry about a longitudinal axis, such that when one is rotated about that axis it performs the mating functions needed to interlock with another part representing its un-rotated self. Interlocking is accomplished by circular tabs and sockets that interfere and prevent the parts from separating once the tabs are in the sockets. The circular tabs are joined to the balance of the housing-half that carries them by a narrow neck and can be sprung over the other housing-half to return to their natural position and fit into a circular socket in that other housing-half. A tapered edge or ramp portion on the underside of each circular tab allows it to automatically spring out of the way as the two parts are moved toward each other in a direction generally perpendicular to the longitudinal axis of the parts. The two housing-halves, once joined, can form an outer surface with useful apertures. Each housing-half contains in a front surface an entire aperture for a detachable probe lead, and each contains in a rear surface at least one half-aperture that, when the two housing-halves are joined, forms a larger aperture whose perimeter engages a corresponding groove in a boot or strain relief that is part of the probe cable. The joined housing-halves have, at places near the middle of their longitudinal axis, an essentially oval cross section of two semi-circles or U-shapes joined by straight line segments. The oval cross section has a fairly high aspect ratio of width to height (indicating that the probe is thin). The cross section of each housing-half (except at the ends) is an extended U-shape whose extent is about half the length of the straight line segments. The exterior surface of the mated housing-halves has, on each side through which runs the line of the mating (meeting) edges, a flat shallow recess. The interlocking circular tabs and sockets are located within the extent of this shallow recess, which can receive an adhesive label that may conceal and stiffen the interlocking circular tabs and sockets.

DESCRIPTION OF A PREFERRED EMBODIMENT

Figure 2:
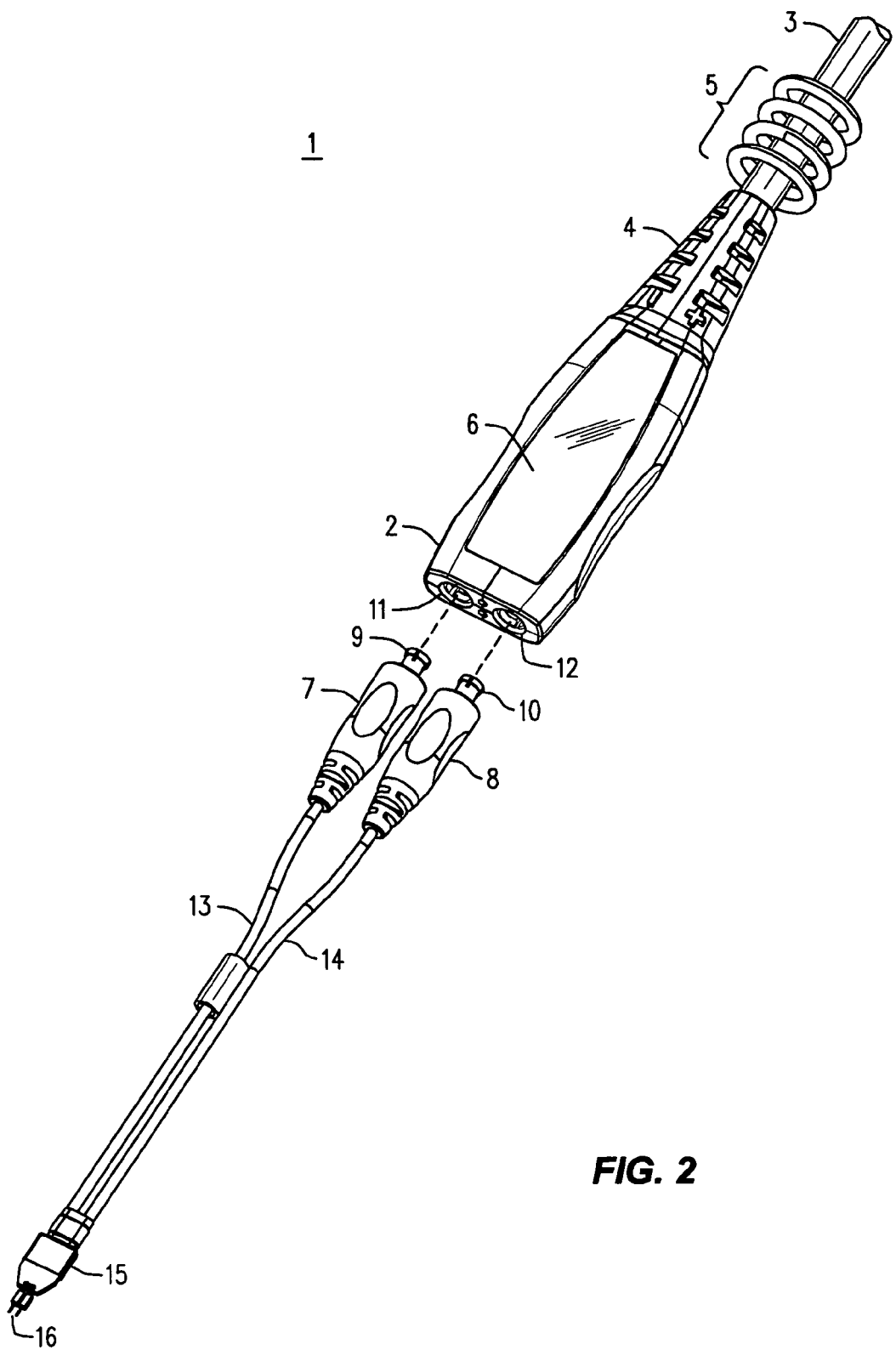
FIG. 2 is a partially exploded perspective view of a thin active probe having a housing constructed in accordance with the principles of the invention.

Refer now to FIG. 2, wherein is shown a partially exploded perspective view 1 of a thin active probe. The probe 2 has internal workings that are to be covered and protected by an outer housing that also anchors a strain relief (or boot) 4 for a cable 3. The cable leads to the instrument or item of test equipment (not shown) that the active probe is associated with. Since there may be several such probes in use at the same time, a collection 5 of removable colored elastic bands is provided to allow easy identification among the probes.

The body of the probe 2 has two relatively broad and flat recessed surfaces, the top-most one of which is visible (the other is parallel to it but on the underside) and that each receive an adhesive label (6 is one), such as metal foil embossed or printed with appropriate indicia.

At the front of the probe body 2 are two apertures 11 and 12. They allow access by plugs 9 and 10 to respective sockets within the probe body 2; those sockets are the electrical connection between the active circuitry within the probe and a rigid or flexible probe tip of some sort that actually contacts the circuit to be measured. In this case the probe tip 16 is flexibly mounted by a pair of leads 13 and 14 that enter gripping bodies 7 and 8 and that are coupled to the plugs 9 and 10. The gripping bodies provide both strain relief and a place from which to manipulate the plugs. The plugs and sockets may be Gilbert GPO connectors, which are small collet type coaxial connector.

The actual probe tip 16 may include coupling resistors or some other isolation network, some components of which may be located in or on assembly 15 (in the drawing there are isolation resistors extending from assembly 15 to make contact with the work circuit). The very ends of the probe tip 16 (in this case, leads from the unsupported ends of the isolation resistors) are solderable, and the metal those leads are made of (nickel) is one that does not conduct heat readily, which property provides some protection from the heat of soldering to the nearby isolation or coupling components.

Figure 1:
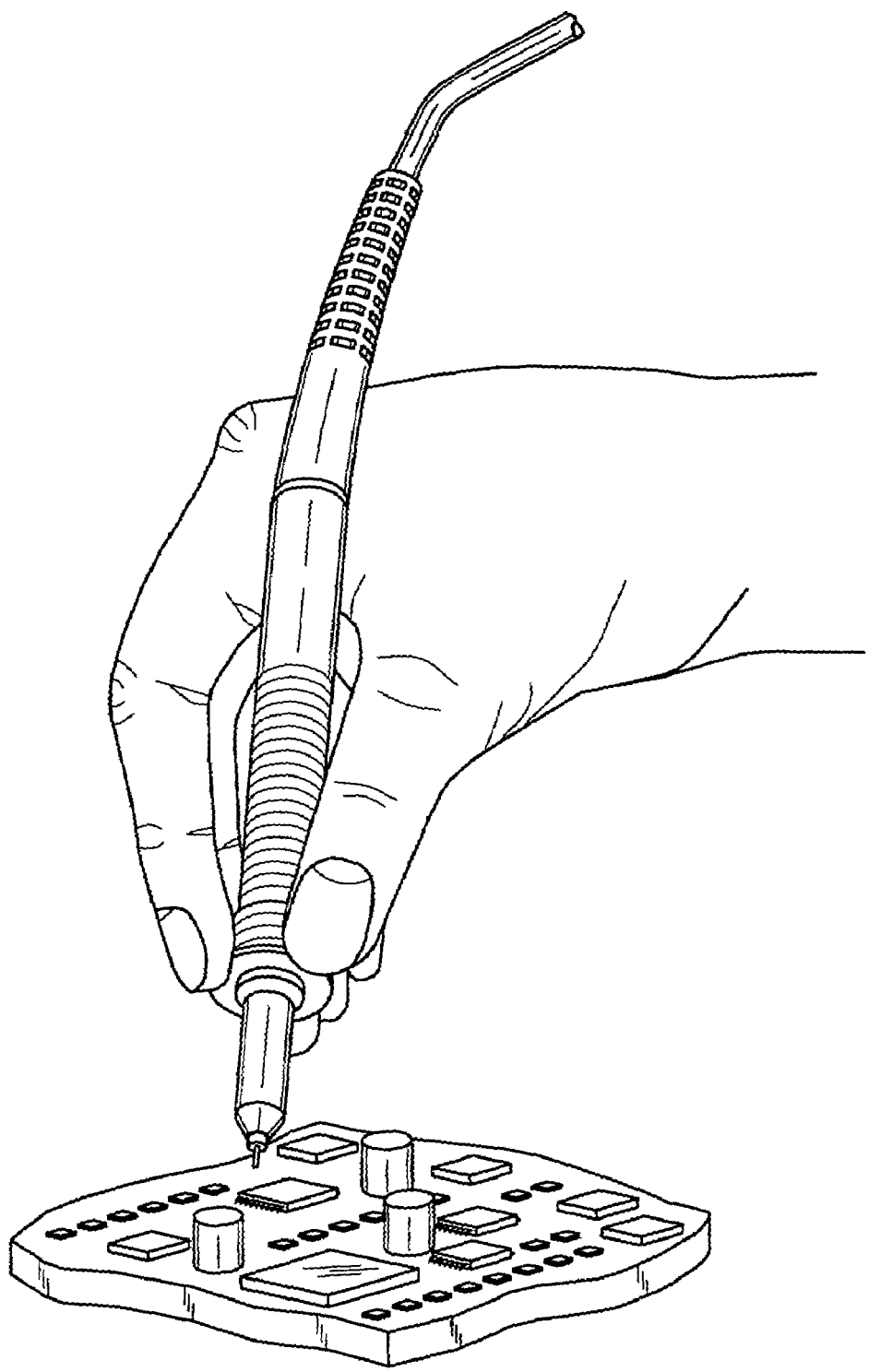
FIG. 1 is a perspective view of a conventional prior art active probe in a work setting.

Although we have not shown one, it will be appreciated that a rigid probe tip that omits the flexible leads is also a useful accessory, say, for probing a circuit by hand in the manner shown in FIG. 1.

Figure 3:
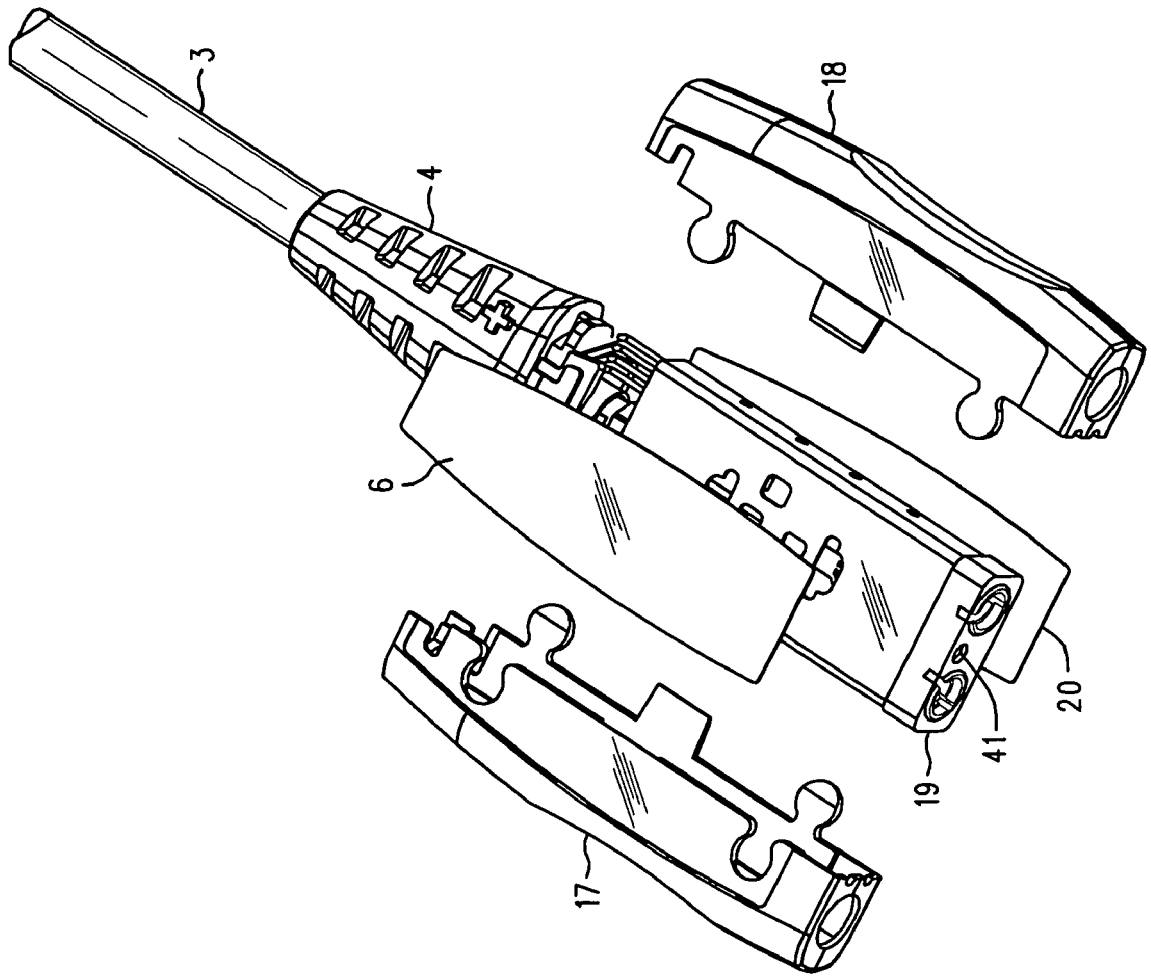
FIG. 3 is a more detailed exploded perspective view of a thin active probe having a housing constructed in accordance with the principles of the invention.

Refer now to FIG. 3. In this view the two adhesive labels 6 and 20 have been exploded away, as have the two identical housing-halves 17 and 18, to reveal the thin shielded chassis 19 containing the active ingredients of the probe. In one embodiment the chassis 19 is fairly small: it will fit inside a box whose interior dimensions are 0.240"×0.580"×1.42". What we are interested in now is how the housing-halves 17 and 18 go together and how the assembled pair of them cooperates with the strain relief/boot 4, as well as with the other desirable properties, such as dis-assembly without undue risk to the chassis 19 and its expensive contents. And, of course, we don't want the assembled housing-halves to be any thicker than needed: for the particular chassis mentioned above the assembled housing-halves (without the strain relief/boot 4 attached) will fit into a box whose inside dimensions are 0.280"×0.720"×1.80", which represents an increase in thickness of only 0.040".

Figure 4:
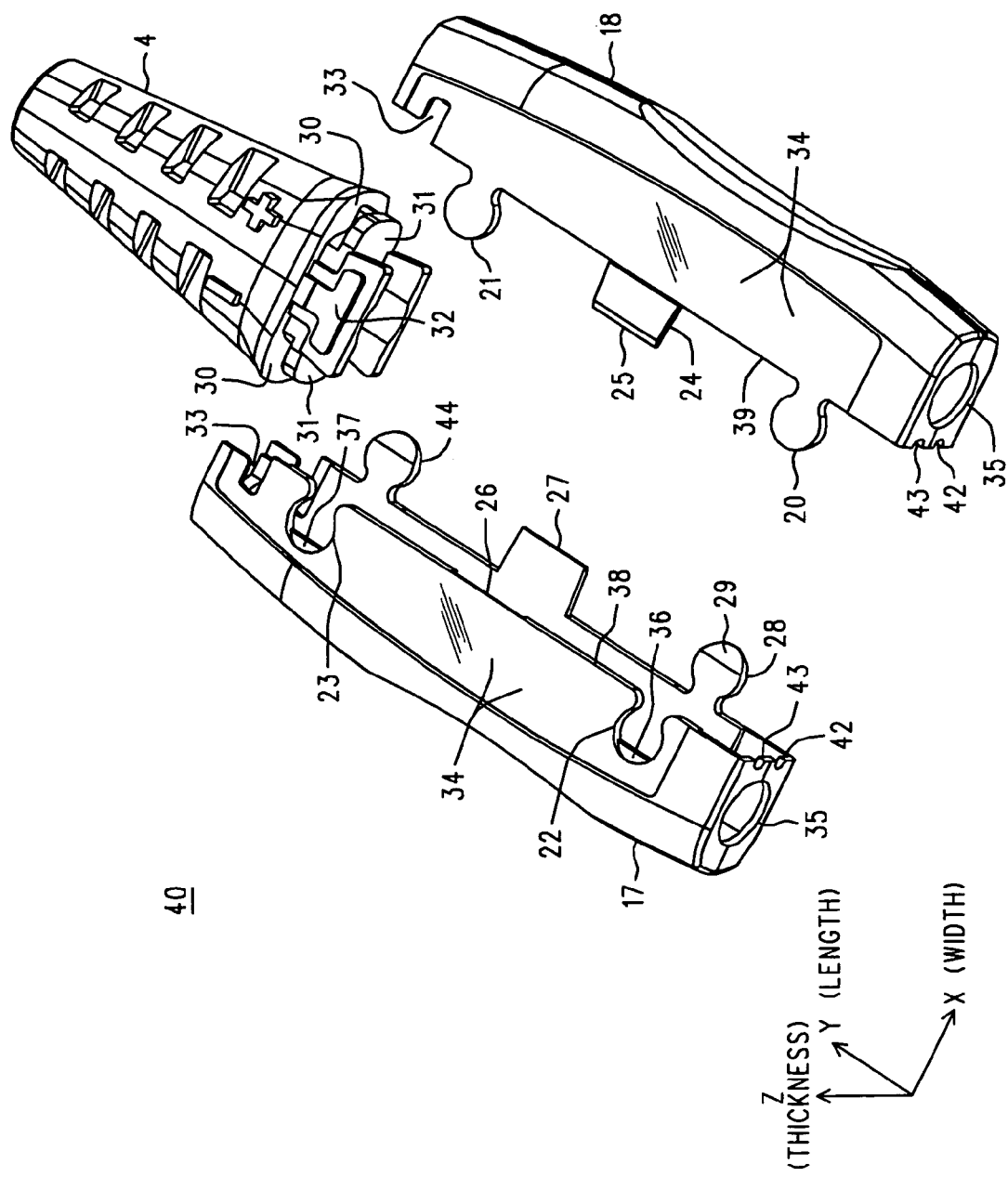
FIG. 4 is a detailed exploded perspective view of the housing-halves and cable strain relief for the active probe housing of FIGS. 2 and 3.

Refer now to FIG. 4, which is an exploded perspective view 40 of the two housing-halves (17, 18) and the strain relief/boot 4; for the sake of clarity the chassis 19 and the cable 3 have been omitted. Our interest in FIG. 4 is in how the two housing-halves go together and engage the strain relief/boot. To begin, we shall state once again that the two housing-halves 17 and 18 are preferably identical, (although that is a convenience and not a necessity) and made of a suitable plastic material (e.g., PC-ABS or 50% polycarbonate and 50% ABS), although plastic is not a necessary choice. Furthermore, it will be understood that there are suitable connections made between the conductors in the cable 3 and the chassis 19, and that, when installed, the chassis is constrained to occupy a particular location within the interior of the assembled housing-halves by suitable recesses, bosses and ledges (all largely unshown) that are parts of the interior surfaces of the housing-halves.

Note the two circular tabs 20 and 21 on the housing-half 18. When the two housing-halves 17 and 18 are assembled, the two circular tabs 21 and 21 will rest inside the two circular sockets 22 and 23, respectively. Those two tabs and sockets are on the upper portion, as depicted in the figure; there are also two more circular tabs (28, 44) and their associated circular sockets (not visible) on the lower portion. Clearly, once a circular tab is in its associated circular socket it is captive in the left-right and front-back directions (i.e., in the X and Y dimensions that are shown in the figure). To accomplish this, the two housing-halves (with the chassis inside one of them) are simply aligned in the Y and Z dimensions, while spaced apart slightly in X. Then they are simply pressed together in X until meeting edges 38 and 39 meet. During this process of engagement the circular tabs one on housing-half will ride up over the outside surface of the narrow opening of the circular socket of the other housing-half; the circular tabs will resiliently flex at their necks. They are further assisted in this by a tapered region on the side that faces the interior of the housing: see region 29 on tab 28.

Once the tabs are over their sockets they snap back into their un-flexed condition, producing the desired interlocking. In each circular socket there is a shelf, or stop, (e.g., 36 in socket 22 and 37 in socket 23) that occupies the space left unused by the tapered regions (e.g., 29) on the tabs. Each shelf and a tapered region "add up to a full tab," so to speak. The purpose of these shelves, or stops, is to prevent the tabs from being pressed inwards and thus clearing the edges of the socket and allowing the housing-halves to separate. (There is some slight clearance between the chassis 19 and the inside surfaces of the housing-halves into which the tabs might descend and cause this mischief.)

Note that there are also two straight tabs 24 and 27, one on each housing-half. Each also has a tapered edge (edge 25 on tab 24), and each enters a correspondingly shaped recess on the other housing-half (recess 26 in housing-half 17). These tabs and their corresponding recesses add to rigidity in the Y direction of the assembled housing-halves, and each straight tab supports in the Z direction that portion of the of the opposing housing-half that is in the middle of the two circular sockets. That is, each straight tab helps hold the associated circular sockets in their original plane, which is that of the (flexed and then) un-flexed circular tabs. What is more, if pressure along the Z direction toward the inside should be applied to the assembled housing-halves in the vicinity of the recess containing the straight tab, and if that attempts to move the sheet of material having the circular sockets inward (toward the chassis), the straight tab itself will also be moved, taking its sheet of material (and the circular tabs, too) in the same direction, reducing the likelihood of tab-socket separation (since both would be displaced in the same direction by about the same amount). That is, squeezing the probe in the Z direction will not cause the housing-halves to unlock and potentially separate.

In final connection with the circular tabs and their sockets, we note that the adhesive label 6, once applied to the shallow recessed region 34, virtually seals the circular tabs into their sockets, by providing interference to any movement of the tabs back into their outwardly flexed state. That is, the adhesive label 6 acts as strong-back attached on every side of the socket to keep the tab inside the socket. The adhesive label label 6 (and its counterpart 20 on the other side of the probe) also serve to protect and conceal the mechanism by which the two housing-halves are latched together.

As for repair, well the label and the housing-halves may be sacrificial. In any event, the label is either peeled off or cut along the line where the parts adjoin along meeting edges 38 and 39. Then the circular tabs are pried up out of their sockets and the housing-halves are pulled apart.

Note circular apertures 35 at the front of the housing-halves. These admit the connectors (9, 10) that couple the leads (13, 14) to the chassis 19. Also note the two pairs of semi-circular holes 42 and 43 in the front of the housing-halves. When the housing-halves are assembled these combine to form two circular holes between the apertures 35 that are clearly visible in FIG. 2 (although they are not there identified with a reference number). One of these holes will line up with a small socket 41 in the front of the chassis 19 that is shown in FIG. 3. Socket 41 is for a ground lead (not shown). For purely contingent layout reasons associated with the chassis 19, the socket 41, while it is in the center along the width dimension, is above center (or below center, if the part were rotated about it length axis) in the thickness dimension. The reason had to do with the desire not to increase the width of the probe, and the fact that there is less free space between the sockets behind apertures 11 and 12 along the line connecting their midpoints than there is above or below that line. Completed holes 42 and 43 are offset from center by the same amount, but only one of them will line up with socket 41; the other is blocked by the front of the chassis 19. This rather minor wart is more than compensated by allowing the housing-halves 17 and 18 to remain identical. If there were separate left and right housing-halves, then with an offset socket 41 there could be just one hole, say, 43. Or, there could be just one hole and identical housing-halves if the socket 41 could be relocated to the midpoint in the thickness dimension.

At the other (rear, or cable) end the assembled housing-halves also form an aperture (not identified yet) and two slots 33 (one on top that is visible, and one underneath that is not). The slots 33 make captive corresponding ridges 32 (one visible, one not) on the strain relief/boot 4. This is part of what makes the strain relief/boot 4 captive to the assembled housing-halves. The other part involves the edges of the as yet unidentified aperture fitting into a slot in the boot 4 between shoulders 30 the back sides of lugs 31. Since this is not so easily seen in this figure, we now invite the reader to turn to FIGS. 5 and 6 for a more satisfactory view.

Figure 5:
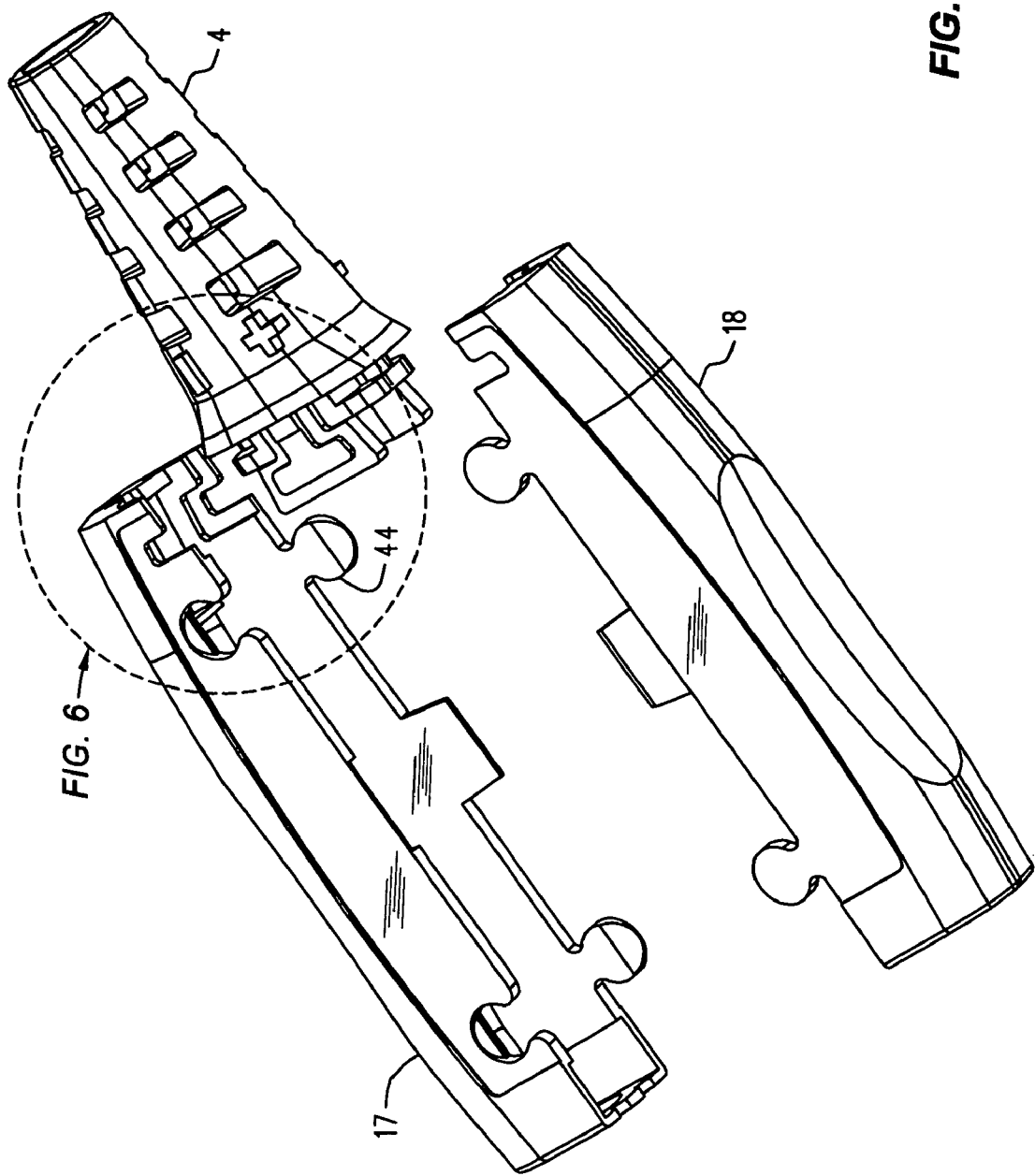
FIG. 5 is a slightly rotated and more detailed view of a rear portion of FIG. 4, indicating a portion of interest.

FIG. 5 is similar to FIG. 4, except that the parts have been rotated slightly to provide a more advantageous view. The dotted circle indicates a portion that is enlarged as FIG. 6. That enlarged view will show approximately half of a symmetrical arrangement (and the other half is the same) that makes the strain relief/boot 4 captive to the assembled housing-halves 17 and 18.

Figure 6:
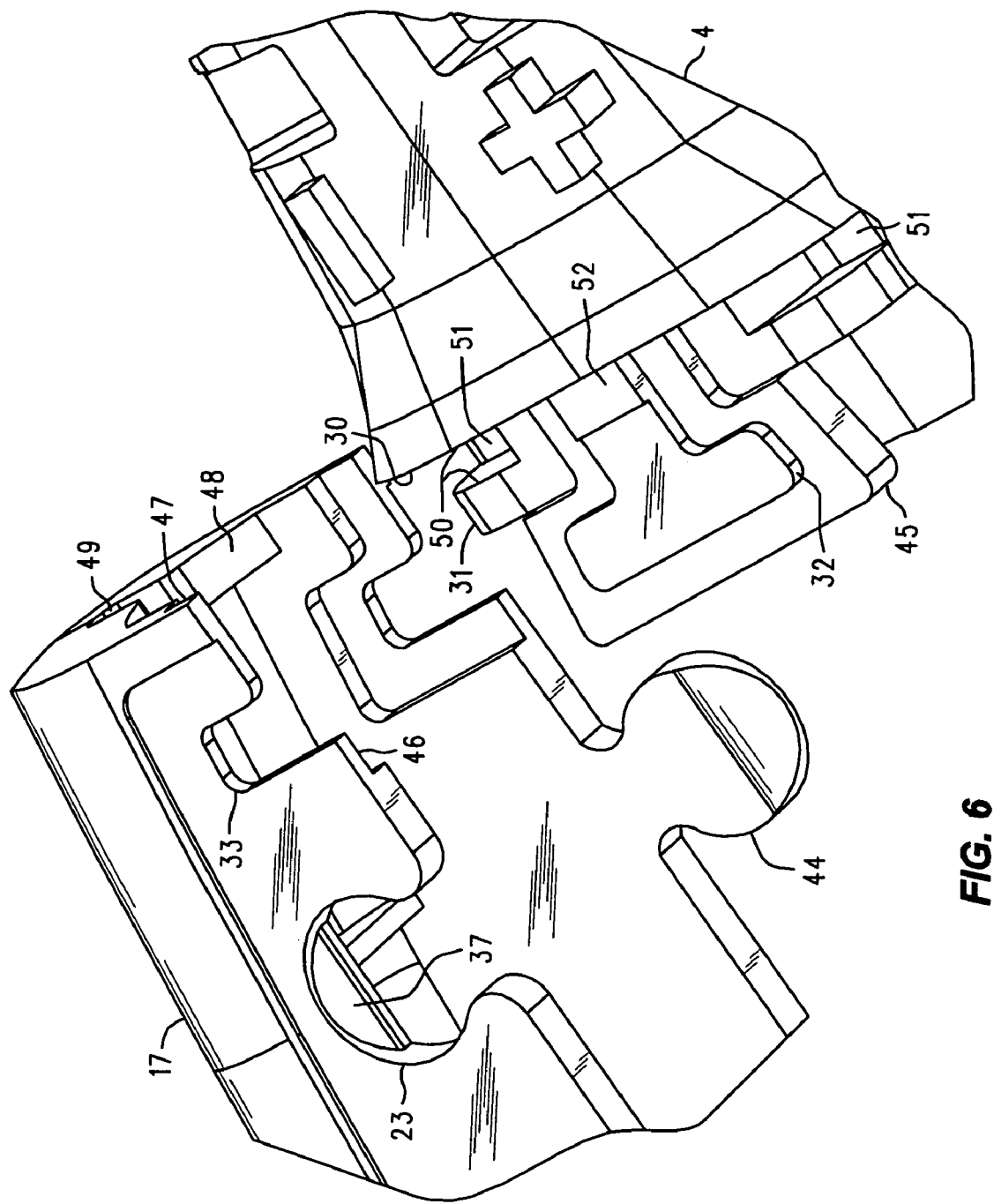
FIG. 6 is an enlarged portion of the indicated region of FIG. 5.

Accordingly, we turn now to FIG. 6. In this view we can see that the rear wall of the housing-half 17 forms one half of an aperture (48, 49, 47). It will be appreciated that the other housing-half forms the identical other half of this aperture. Briefly, the aperture has a wall thickness (not identified) that fits into the slot 50 formed between the face of shoulder 30 and lug 31 of the boot 4. This anchors the boot against pushing and pulling along the length axis. The strain relief/boot 4 is preferably made of a flexible material, such as silicone rubber. To the extent that is flexible, it is also somewhat compressible, which is at odds with resisting rotation in the rear aperture of the assembled housing; a pronounced non-circular region of contact is needed. To assist in prohibiting rotation of the boot 4 in the assembled housing-halves, the boot has a lug, or shelf, 51 within the slot 50 that extends into a recesses 49 in the aperture at the rear of the housing. To aid in good anchoring during times when the strain relief/boot 4 undergoes bending, it extends somewhat into the assembled housing-halves and is further made captive by the TEE-shaped pad 45 and 52 that engages recesses 46 and 47 and slot 33.

In conclusion, it will be appreciated that, while we have illustrated the use of the invention in an electronic setting that used two identical parts, there are variations possible where the "circular tab and circular socket with intervening (or occasionally as needed) straight tab for support technique" (the 'tab & socket' technique) can be used to advantage in other settings. The circular tabs and their sockets need not be circular; they could be square, or oval shaped, for example. Nor does the number of housing parts need to be two, nor do the parts need to be identical. In general, the assembled housing needs to have an appropriate shape, which is application dependent, and the number of housing-pieces used to achieve that shape is not fixed in advance. What is special about the tab & socket with stiffening tab technique is that it lends itself well to thin housings and possible concealment with a label, whether for anti-tampering purposes, or simple esthetics. The tab & socket fasteners can be disposed almost anywhere along the lines where the housing-pieces meet (along meeting edges of those housing-pieces), and especially in the case of non-symmetrical pieces, at odd places over the surface of the assembled housing where needed, and that may not have a corresponding symmetric location elsewhere. So, for example, a housing-piece might include a corner or a bulge, and have fasteners along straight or curved lines that might lie in different planes, or on surfaces that are not planar.

Figure 7:
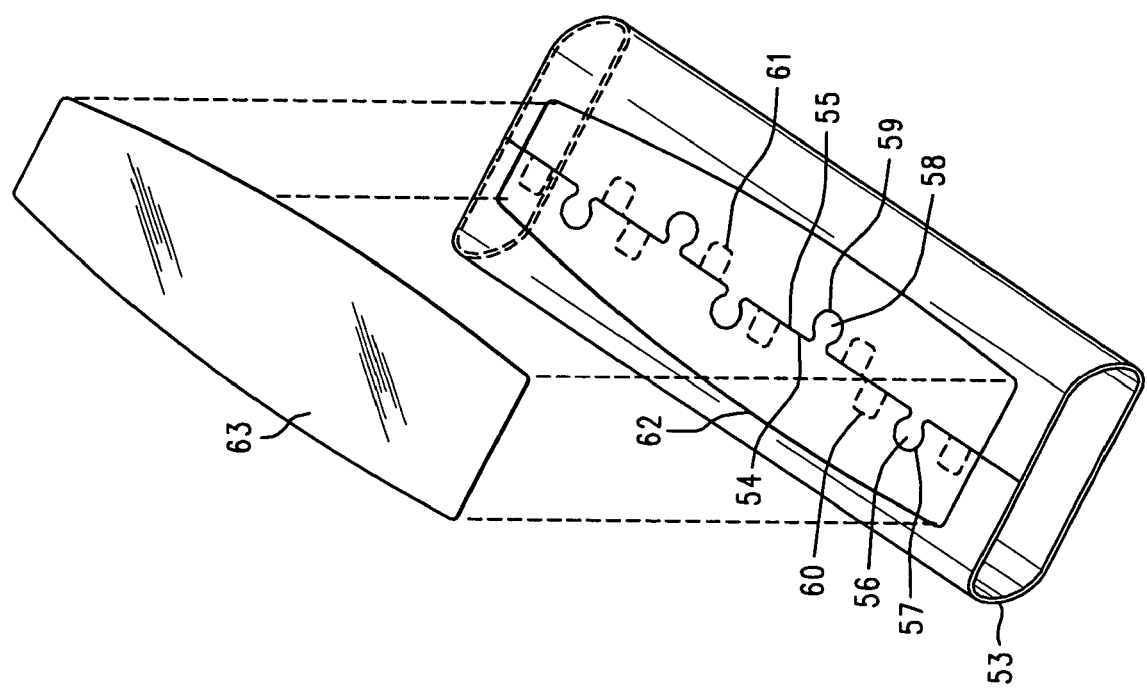
FIG. 7 is a simplified perspective view of an alternate embodiment of the invention using only a single housing-piece.

As a final example, the housing could be a single wrap-around housing-piece that, owing to a flexible nature of the material of which it is made, encloses an object and then attaches to itself. Further more, and in contrast to what has been shown to this point, it is not the case that all the tabs need to be on one side of a meeting edge for a housing-piece, with all the sockets on the other. That, too, is only one possibility, as a given meeting edge on a housing-piece could have both tabs and sockets (as well as stiffening tabs and their associated recesses), although this may impose conditions that further determine whether or not the all the housing-pieces can be identical. FIG. 7 is an illustration of these possibilities, wherein sleeve 53 is a one-piece housing to fastened upon itself. It may exhibit a natural curvature that approaches its final assembled form, or it might lay flat when un-assembled; the former is probably preferable to assist in the meeting edges 54 and 55 having the same tangent line after assembly (i.e., the joint is smooth and not buckled). In any event, note that the various socket/tab combinations (56/57 and 58/59) show that there are both sockets and tabs on either side of the joint (54, 55). Likewise, note that the various stiffening tabs 60 and 61 are disposed on both side of the joint, and recur as needed to provide support on both sides of a tab. Finally, there is also a recess 62 for an adhesive backed label 63 to secure and conceal the fasteners.

We claim:

1. An enclosure for an object, the enclosure comprising:
   a plurality of housing pieces that when assembled to one another enclose the object to a desired extent, each individual housing piece meeting at least one other of the plurality along meeting edges; and
   at least one locking tab disposed along a first meeting edge of a first housing piece and attached to the first housing piece by a connecting region narrower than the maximum width of the locking tab it attaches and that flexes resiliently;
   a socket for each locking tab, the socket opening onto a second meeting edge of a second housing piece and having a shape that exactly envelopes a corresponding locking tab and its connecting region;
   each locking tab including a tapered edge disposed opposite the connecting region of the locking tab and disposed on what will be the interior surface of the enclosure when the plurality of housing-pieces is assembled; and
   each socket including a shelf disposed to overlap at least a portion of the tapered region of its corresponding locking tab when the locking tab occupies the socket.

2. An enclosure as in claim 1 wherein there are at least two locking tabs disposed along the first meeting edge and two corresponding sockets disposed along the second meeting edge, and further comprising:
   a stiffening tab projecting from the first meeting edge and located between two locking tabs, the stiffening tab being of reduced thickness so as to have an exterior surface that lies beneath the outer surface of the enclosure; and
   a recess in the interior surface of the second housing piece and that extends to the second meeting edge and receives the stiffening tab.

3. An enclosure as in claim 1 wherein there are at least one locking tab and one socket adjacently disposed along the first meeting edge and a corresponding socket and a corresponding tab disposed along the second meeting edge, and further comprising:
   a stiffening tab projecting from the first meeting edge and located between a locking tab and its adjacent socket, the stiffening tab being of reduced thickness so as to have an exterior surface that lies beneath the outer surface of the enclosure; and
   a recess in the interior surface of the second housing piece and that extends to the second meeting edge and receives the stiffening tab.

4. An enclosure as in claim 1 further comprising a recessed region on the outer surface of the assembled enclosure that encompasses at least one pair of adjoining meeting edges, and that further comprises an adhesive label affixed to and within the recessed region.

5. An enclosure as in claim 1 wherein the plurality of housing-pieces comprises identical housing pieces.

6. An enclosure as in claim 5 wherein the plurality of housing-pieces exhibit complementary self-symmetry when rotated about a longitudinal axis.

7. An enclosure as in claim 1 wherein the plurality of housing pieces is two identical housing pieces, the enclosure encloses a chassis for an electronic apparatus and further comprising an aperture that interlocks with a strain relief for a cable.

8. An enclosure as in claim 7 wherein the enclosure and the chassis are for an active probe.

9. An enclosure for an object, the enclosure comprising:
- a single housing piece that when assembled to itself encloses the object to a desired extent, the housing piece having at least two meeting edges; and
- at least one locking tab disposed along a first meeting edge and attached to the housing piece by a connecting region narrower than the maximum width of the locking tab it attaches and that flexes resiliently;
- a socket for each locking tab, the socket opening onto a second meeting edge and having a shape that exactly envelopes a corresponding locking tab and its connecting region;
- each locking tab including a tapered edge disposed opposite the connecting region of the locking tab and disposed on what will be the interior surface of the enclosure when the plurality of housing-pieces is assembled; and
- each socket including a shelf disposed to overlap at least a portion of the tapered region of its corresponding locking tab when the locking tab occupies the socket.

10. An enclosure as in claim 9 wherein there are at least two locking tabs disposed along the first meeting edge and two corresponding sockets disposed along the second meeting edge, and further comprising:
- a stiffening tab projecting from the first meeting edge and located between two locking tabs, the stiffening tab being of reduced thickness so as to have an exterior surface that lies beneath the outer surface of the enclosure; and
- a recess in the interior surface of the second housing piece and that extends to the second meeting edge and receives the stiffening tab.

11. An enclosure as in claim 9 wherein there are at least one locking tab and one socket adjacently disposed along the first meeting edge and a corresponding socket and a corresponding tab disposed along the second meeting edge, and further comprising:
- a stiffening tab projecting from the first meeting edge and located between a locking tab and its adjacent socket, the stiffening tab being of reduced thickness so as to have an exterior surface that lies beneath the outer surface of the enclosure; and
- a recess in the interior surface of the second housing piece and that extends to the second meeting edge and receives the stiffening tab.

12. An enclosure as in claim 9 further comprising a recessed region on the outer surface of the assembled enclosure that encompasses at least one pair of adjoining meeting edges, and that further comprises an adhesive label affixed to and within the recessed region.

* * * * *